(12) United States Patent
Bodin et al.

(10) Patent No.: US 6,311,223 B1
(45) Date of Patent: Oct. 30, 2001

(54) EFFECTIVE TRANSMISSION OF DOCUMENTS IN HYPERTEXT MARKUP LANGUAGE (HTML)

(75) Inventors: William Kress Bodin; Ted Ralph Mueller, both of Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/963,456

(22) Filed: Nov. 3, 1997

(51) Int. Cl.[7] ................................................ G06F 15/16
(52) U.S. Cl. .......................... 709/247; 709/201; 704/9; 707/513
(58) Field of Search ..................................... 709/247, 201, 709/200, 229, 227, 218, 219, 217; 707/501, 5, 513, 1, 523, 6, 4, 104; 345/357, 419

(56) References Cited

U.S. PATENT DOCUMENTS

| | | | |
|---|---|---|---|
| 5,051,745 | | 9/1991 | Katz ........................................ 341/51 |
| 5,099,420 | * | 3/1992 | Carlgren et al. .......................... 704/9 |
| 5,243,520 | * | 9/1993 | Jacobs et al. ............................ 704/9 |
| 5,530,852 | | 6/1996 | Meske, Jr. et al. ................... 395/600 |
| 5,659,755 | * | 8/1997 | Strohacker ............................ 708/203 |
| 5,708,806 | * | 1/1998 | DeRose et al. ....................... 707/104 |
| 5,708,825 | * | 1/1998 | Sotomayor ........................... 707/501 |
| 5,737,619 | * | 4/1998 | Judson ................................. 707/500 |
| 5,752,021 | * | 5/1998 | Nakatsuyama et al. .................. 707/5 |
| 5,819,265 | * | 10/1998 | Ravin et al. ............................. 707/5 |
| 5,832,480 | * | 11/1998 | Byrd, Jr. et al. ......................... 707/5 |
| 5,854,597 | * | 12/1998 | Murashita et al. ..................... 341/51 |
| 5,878,406 | * | 3/1999 | Noyes .................................. 706/55 |
| 5,884,014 | * | 3/1999 | Huttenlocher et al. .............. 395/114 |
| 5,890,103 | * | 3/1999 | Carus ...................................... 704/9 |
| 5,890,171 | * | 3/1999 | Blumer et al. ........................ 707/501 |
| 5,893,916 | * | 4/1999 | Dooley ................................ 707/523 |
| 5,895,463 | * | 4/1999 | Dowling et al. ......................... 707/3 |
| 5,907,621 | * | 5/1999 | Bachman et al. ....................... 380/25 |
| 5,933,822 | * | 8/1999 | Braden-Harden et al. .............. 707/5 |
| 5,948,054 | * | 9/1999 | Nielsen ................................ 709/200 |
| 5,948,066 | * | 9/1999 | Whalen et al. ....................... 709/229 |
| 5,953,526 | * | 9/1999 | Day et al. ............................. 395/701 |
| 5,963,205 | * | 10/1999 | Sotomayor ........................... 345/333 |
| 5,983,248 | * | 11/1999 | DeRose et al. ....................... 707/907 |
| 6,009,441 | * | 12/1999 | Mathieu et al. ...................... 707/516 |
| 6,041,331 | * | 3/2000 | Weiner et al. ........................ 707/103 |
| 6,041,355 | * | 3/2000 | Toga ..................................... 709/227 |
| 6,061,697 | * | 5/2000 | Nakao .................................. 707/513 |

FOREIGN PATENT DOCUMENTS

| | | | | | |
|---|---|---|---|---|---|
| 0896284 A1 | * | 2/1999 | (EP) | ............................. | G06F/17/30 |
| 0928070 A2 | * | 7/1999 | (EP) | ............................. | H03M/7/30 |
| 0952533 A2 | * | 10/1999 | (EP) | ............................. | G06F/17/30 |

OTHER PUBLICATIONS

Ayre et al., Internet Access: Just Browsing with Java, PC Magazine, Mar. 1996.*

Brooks, Peter L., Looking for Data in all the Wrong Places, Technology Information, Oct. 1997.*

* cited by examiner

*Primary Examiner*—Robert B. Harrell
*Assistant Examiner*—William C. Vaughn, Jr.
(74) *Attorney, Agent, or Firm*—David A. Mims, Jr.; J. B. Kraft

(57) ABSTRACT

A data processor controlled display system for displaying documents including natural language text representative of data transmitted in a markup language such as HTML to a display station from a location remote from said station. The HTML tags are tokenized prior to transmission, comments are removed from the HTML file prior to transmission and the file is then subjected to a conventional general text compression. After the HTML file is received at the display station, it is decompressed, detokenized and the resulting HTML file is used to create a document or page on the display.

12 Claims, 5 Drawing Sheets

EFFECTIVE TRANSMISSION OF DOCUMENTS IN HYPERTEXT MARKUP LANGUAGE (HTML)

TECHNICAL FIELD

The present invention relates to computer managed communication networks and particularly to the transmission of documents in markup language format from remote distribution points to computer controlled user interactive display terminals which would be available to interactive users in a networking environment such as the internet or equivalent proprietary or public networks.

BACKGROUND OF THE INVENTION

The 1990's decade has been marked by a societal technological revolution driven by the convergence of the data processing industry with the consumer electronics industry. Like all such revolutions, it unleashed a great ripple effect of technological waves. The effect has in turn driven technologies which have been known and available but relatively quiescent over the years. Two of these technologies are the internet-related distribution and object oriented programming systems. The convergence of the electronic entertainment and consumer industries with data processing exponentially accelerated the demand for wide ranging communications distribution channels, and the World Wide Web or internet which had quietly existed for over a generation as a loose academic and government data distribution facility reached "critical mass" and commenced a period of phenomenal expansion. With the expanded accessibility of tens of thousands of programmers to each other, not to mention to potential users of such programs via the expanded internet client base, an obvious need became apparent: cooperative programming systems wherein program developers could coact to continuously expand and enhance existing programs in a distributed programming environment. Object oriented programming offered the solution. With its potentially interchangeable objects or units, object oriented programming systems have found acceptance as the programming system for the internet. In all areas of data processing and communications, as well as the electronic entertainment and consumer industries having anything to do with the internet, there has been a substantial movement to object oriented programming systems and particularly to the Java programming system. A major significance of Java is that it is an internet or World Wide Web distributed programming system where literally thousands of program developers and users are continually upgrading and changing the programs. There arose a need for programmers and users to readily being able to display program documentation in a clear and comprehensive manner in natural language. Hypertext Markup Language (HTML), which had been the documentation language of the internet world wide web for years, offered an answer and more. It offered direct links between pages and other documentation on the web and a variety of related data sources which were at first text and then evolved into media, i.e. "hypermedia".

Now the combination of Java object oriented programming and HTML has taken an even greater advance in Web pages: Java code and programs are being created which will exist on web pages where they offer the user the option of downloading and executing such code or programs when the page is being browsed. These programs are embedded in the web page as applets.

With all of these rapidly expanding functions of web pages and like documentation, it should be readily understandable that the demand for web documents has been expanding exponentially in recent years. In addition to the proliferating standard uses of HTML for text and media related world wide web pages for commercial, academic and entertainment purposes, the Java documentation program, JavaDoc, will produce standard HTML files for outputs to computer controlled displays to provide standard natural language displays of the program documentation. Thus, HTML has become the display language of choice for the internet or World Wide Web. It is used there for all forms of display documentation including the markup of hypertext and hypermedia documents, usually stored with their respective documents on an internet or web server in addition to the above described programming distribution. HTML is an application of SGML (Standard Generalized Markup Language), an ISO standard for defining the structure and contents of any digital document. It should be recognized that any of the aspects of the present invention illustrated with respect to HTML would be equally applicable to SGML. For further details on Java, JavaDoc or HTML, reference may be made to the texts "Just Java", 2nd Edition, Peter van der Linden, Sun Microsystems, Inc., 1997, or "Java in a Nutshell", 2nd Edition, by David Flanagan, O'Reilly publisher, 1997.

It must be recognized that HTML, as well as other markup languages for web pages, originated at a time when the demand for web pages and related documentation was relatively modest. It could be said that the present day demand on web page resources and markup languages was probably inconceivable when these were developed. Accordingly, it is the objective of the present invention to provide implementations which go well beyond conventional general data compression whereby the markup languages used in web page development, transmission and use may be downloaded and used more effectively with less wasted time.

SUMMARY OF THE INVENTION

The present invention relates to a computer controlled display systems for displaying documents e.g., web pages including natural language text representative of data transmitted to display stations from a location remote from said stations e.g., web servers where the data is stored in a markup language format including tags identifying the contents of said data. One key aspect of the present invention is the provision of means for tokenizing the tags prior to the transmission of data from the server to the display station and then detokenizing said tokenized tags received at the display station whereby said received data is restored to said markup language format. Then, there are means associated with the display station for translating said received data from said markup language format into said displayed natural language text documents. The preferable markup language is of course HTML. Another aspect of the invention is directed to portions of the data to be transmitted, identified by tags, as comments. Means are provided for removing the data portions identified as comments prior to transmitting said data.

All of the above expedients may be combined with standard general data compression means for compressing, prior to said transmitting, the data portions remaining after tag tokenizing comments removal, and means for decompressing said compressed data portions received at the display station so that the received data is restored to said markup language format.

DETAILED DESCRIPTION OF THE PREFERRED EMBODIMENT

Before going into the details of specific embodiments, it will be helpful to understand from a more general perspective the various elements and methods which may be related to the present invention. Some of the documents on which the present invention may be used are in the Java Programming system which is an object oriented system utilizing the Java programming language. The Java system and language are extensively familiar to those skilled in the art. The text, "Just Java", Peter van der Linden, described above comprehensively details the system and language.

The HTML language is also described in detail in the above "Just Java" text and particularly at Chapter 7, pp. 249–268, dealing with the handling of web pages with embedded Java programs and also in the text, "Mastering the Internet", Cady and McGregor, published by Sybex, San Francisco, 1996 and particularly pp. 637–642 on HTML in the formation of web pages.

Figure 1:
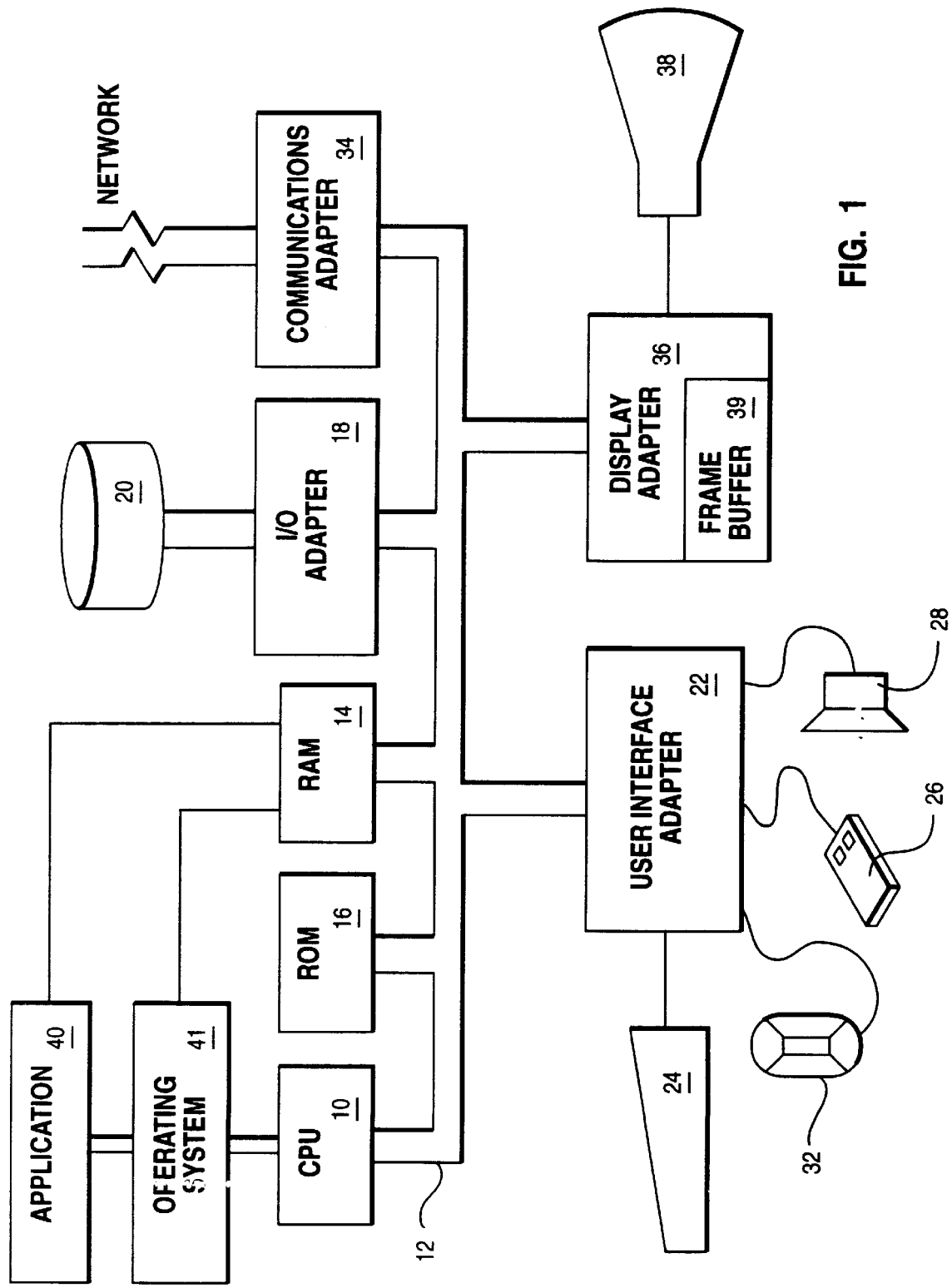
FIG. 1 is a block diagram of a data processing system including a central processing unit and network connections via a communications adapter which is capable of implementing a user interactive workstation on which the received data may be converted into a web page in accordance with the present invention.

Referring to FIG. 1, a typical data processing system is shown which may be used in conjunction with object oriented software such as Java (™ of Sun Microsystems, Inc.) and HTML in implementing the present invention on the receiving interactive workstation. A central processing unit (CPU), such as one of the PowerPC microprocessors available from International Business Machines Corporation (PowerPC is a trademark of International Business Machines Corporation) is provided and interconnected to various other components by system bus 12. An operating system 41 runs on CPU 10 and provides control and is used to coordinate the function of the various components of FIG. 1. Operating system 41 may be one of the commercially available operating systems such as DOS or the OS/2 operating system available from International Business Machines Corporation (OS/2 is a trademark of International Business Machines Corporation). Any conventional network browser system involving HTML language with embedded Java applets forms part of application 40, runs in conjunction with operating system 41 and provides output calls to the operating system 41 which implements the various functions to be performed by the HTML application 40. The browser program, in combination with the operating system, provides the basic receiving workstation on which the web pages, according to the present invention, may be implemented.

A read only memory (ROM) 16 is connected to CPU 10, via bus 12 and includes the basic input/output system (BIOS) that controls the basic computer functions. Random access memory (RAM) 14, I/O adapter 18 and communications adapter 34 are also interconnected to system bus 12. It should be noted that software components including the operating system 41 and the browser and HTML applications 40 are loaded into RAM 14 which is the computer system's main memory. I/O adapter 18 may be a small computer system interface (SCSI) adapter that communicates with the disk storage device 20, i.e. a hard drive. Communications adapter 34 interconnects bus 12 with an outside network enabling the workstation to communicate with web servers over a local area network (LAN), wide area network (WAN) which includes, of course, the internet or World Wide Web. I/O devices are also connected to system bus 12 via user interface adapter 22 and display adapter 36. Keyboard 24, trackball 32 and mouse 26 are all interconnected to bus 12 through user interface adapter 22. Display adapter 36 includes a frame buffer 39 which is a storage device that holds a representation of each pixel on the display screen 38. Images may be stored in frame buffer 39 for display on monitor 38 through various components such as a digital to analog converter (not shown) and the like. By using the aforementioned I/O devices, a user is capable of inputting event data and other information to the system through the keyboard 24, trackball 32 or mouse 26 and receiving output information from the system via display 38.

An embodiment of the present invention will be described which uses HTML to document Java APIs. JavaDoc, which is described in additional detail on pp. 253 to 256 of the above referenced "Java in a Nutshell" text, is the Java documentation generator. It generates API documentation in HTML format for a specified Java package. It parses the source files, reads them and generates HTML documentation files that describe each public class defined in the source files. An HTML file at its most basic level is, in effect, a blueprint of how the web page is to be constructed. As set forth above, because of the increased function for which web pages are used, their structure and syntax have grown substantially. With the use of comprehensive web technologies such as Forms, Java and JavaScript for example, an increasing number of HTML tags are required in an HTML file as well as additional text. HTML files have increased to the point that it is not uncommon for an HTML file to be larger than the resources to which it refers such as a Java applet or .GIF file. Also adding to the size of the HTML file are comments which are typically left in the file by the programmer or HTML file generator. These comments add substantially to the size of the file without enhancing web page function. Surprisingly, we have found that the download time for a transmitted HTML file may be substantially reduced by tokenizing the HTML tags before transmission of the files to display stations. Because of the increased complexity and size of HTML files, the tags within the files have become so numerous that their reduction in size by tokenizing significantly reduces download time.

The present invention is network related. We will not go into great detail in describing the networks to which the present invention is applicable. U.S. Pat. Nos. 5,295,244, Dev et al. and 5,353,399, Kuwamoto et al. adequately detail conventional networks to which the present invention would be applicable including appropriate network management and display terminal access to such networks. Reference has also been made to the applicability of the present invention to a global network such as the internet. For details on internet nodes, objects and links, reference is made to the above referenced text, *Mastering the Internet,* G. H. Cady et al., published by Sybex, Inc., Alameda, Calif., 1996.

Any data communication system which interconnects or links computer controlled systems or network objects at various sites or network nodes defines a communications network. A network may be as simple as two linked computers or it may be any combination of LANS (Local Area Networks) or WANS (Wide Area Networks). Of course, the internet is a global network of a heterogeneous mix of computer technologies and operating systems.

Figure 2:
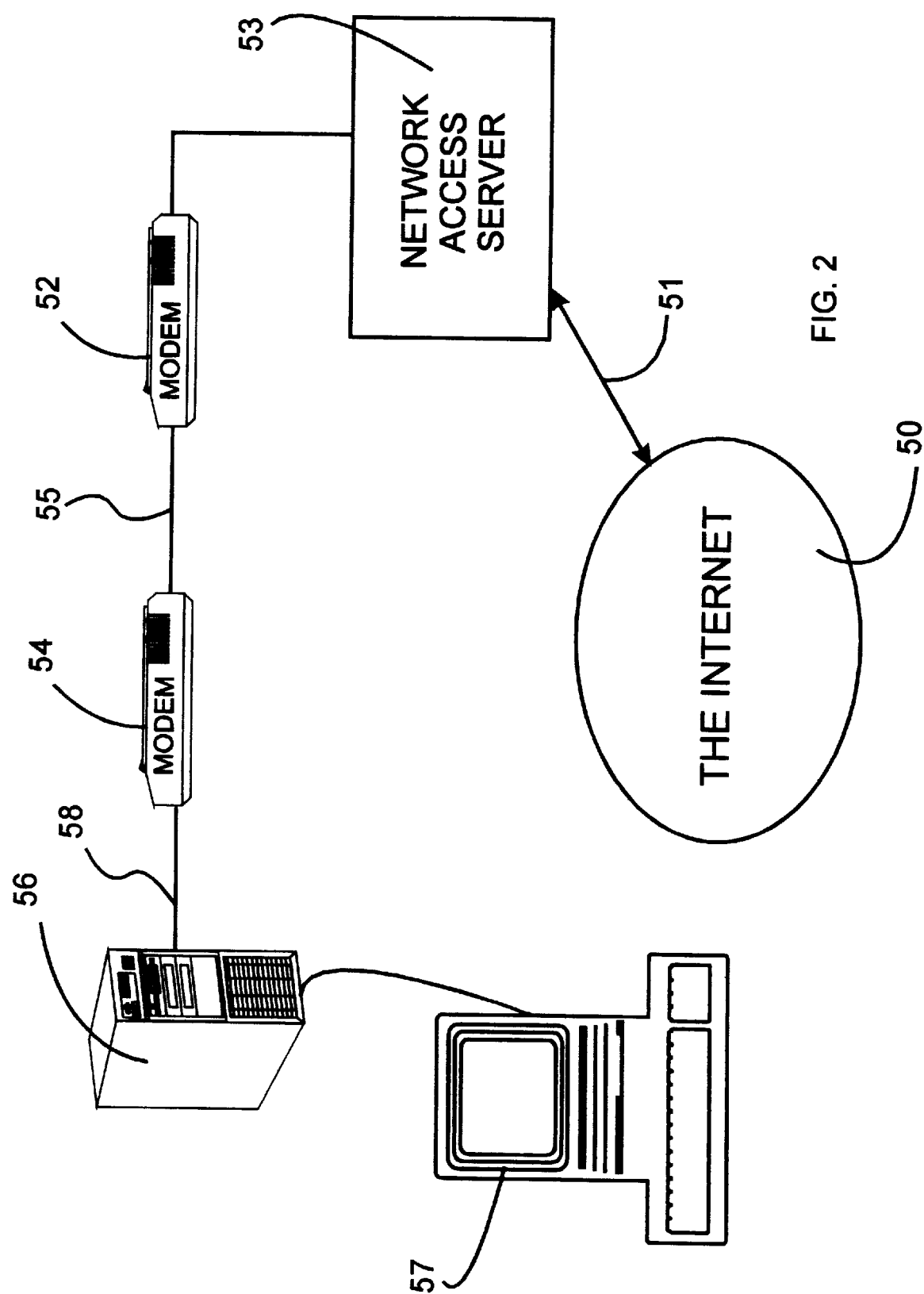
FIG. 2 is a generalized diagrammatic view of an internet portion upon which the present invention may implemented.

A generalized diagram of a portion of an internet which the computer 56 controlled display terminal 57 used for web page or other document display of the present invention is connected as shown in FIG. 2. Computer 56 and display terminal 57 are the computer system shown in FIG. 1 and connection 58 (FIG. 2) is the network connection shown in FIG. 1.

Reference may be made to the above-mentioned text, *Mastering the Internet,* Cady et. al., particularly at pp. 136–147 for typical connections between local display workstations to the internet via network servers any of which may be used to implement the system on which this invention is used. The system embodiment of FIG. 2 is one of these known as a host-dial connection. Such host-dial connections have been in use for over 30 years through network access servers 53 which are linked 51 to the net 50. The servers 53 are maintained by a service provider to the client's display terminal 57. The host's server 53 is accessed by the client terminal 57 through a normal dial-up telephone linkage 58 via modem 54, telephone line 55 and modem 52. The HTML files are downloaded to display terminal 57 through controlling computer 56 via the telephone line linkages from server 53 which may have accessed them from the internet 50 via linkage 51.

Figure 3:
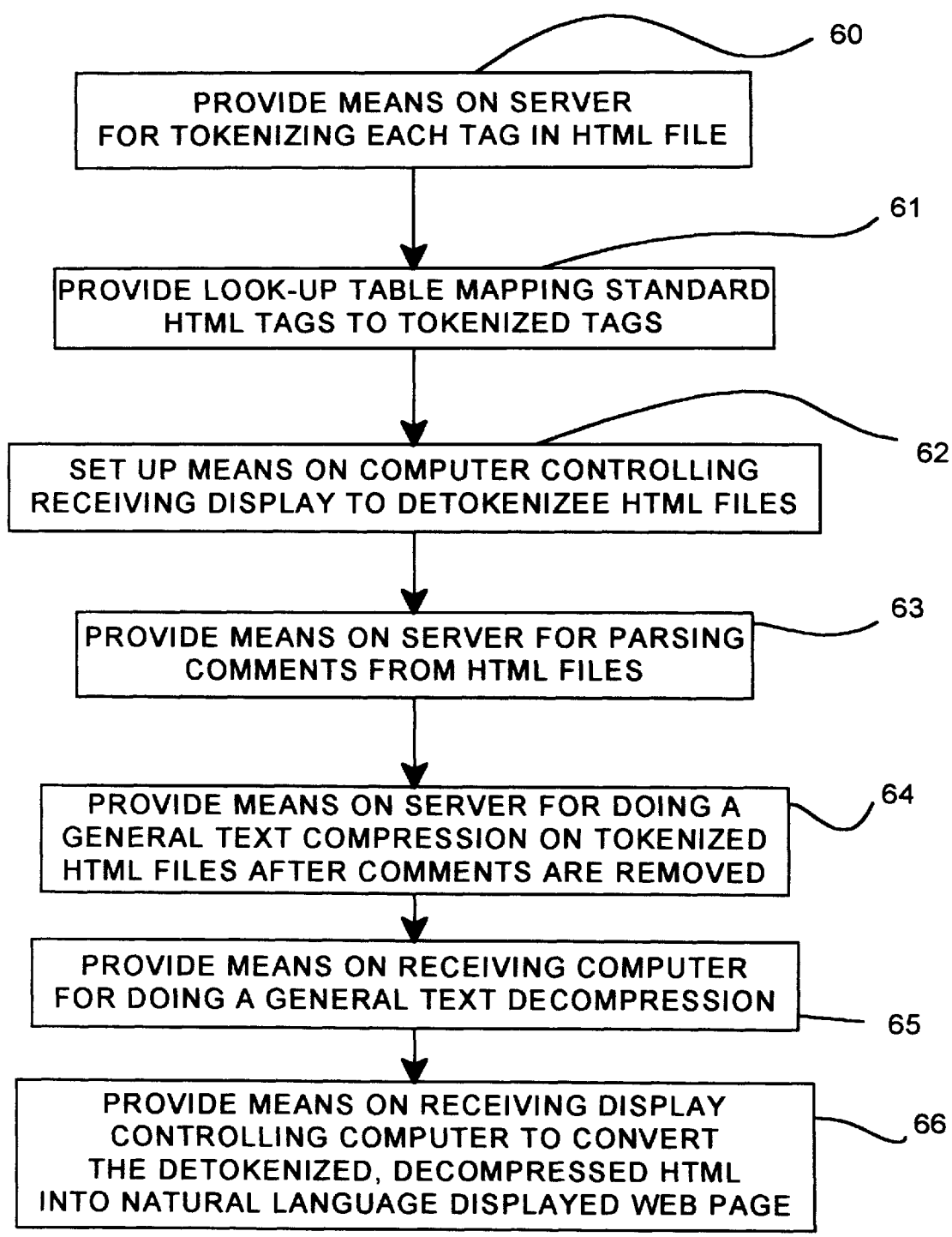
FIG. 3 is a flowchart describing the operations involved in substantially reducing HTML file transmission time in accordance with the present invention.

The present invention will now be described with respect to the flowcharts of FIGS. 3 and 4. In the embodiment, HTML, Java language and code are used. These are fully described in the three previously referenced texts. FIG. 3 is a chart showing the development of the system of the present invention. Step 60: means are provided on network access server 53 in FIG. 2 for tokenizing each HTML tag in sequence using an appropriate lookup table, step 61 which will be described in greater detail subsequently with respect to FIG. 4. Since the HTML tags, which are tokenized for transmission to the receiving workstation, 56 and 57, FIG. 2, will have to be detokenized before use on display 57, means will have to be set up on display control computer 56 to detokenize the received data, step 62, FIG. 3. Also, means must be provided on the network access server 53 for parsing any comments out of the HTML files prior to transmission, step 63. Then, means are provided on the network access server for doing a general text compression on the tokenized HTML files prior to transmission, step 64. Then, after transmission, means are provided on the receiving workstation computer 56, FIG. 2, for doing a general text decompression, step 65, which complements the general text compression of step 64. Finally, step 66, means are provided for receiving computer 56 for converting the detokenized, decompressed HTML into a natural language web page on display 57, FIG. 2.

Figure 4A:
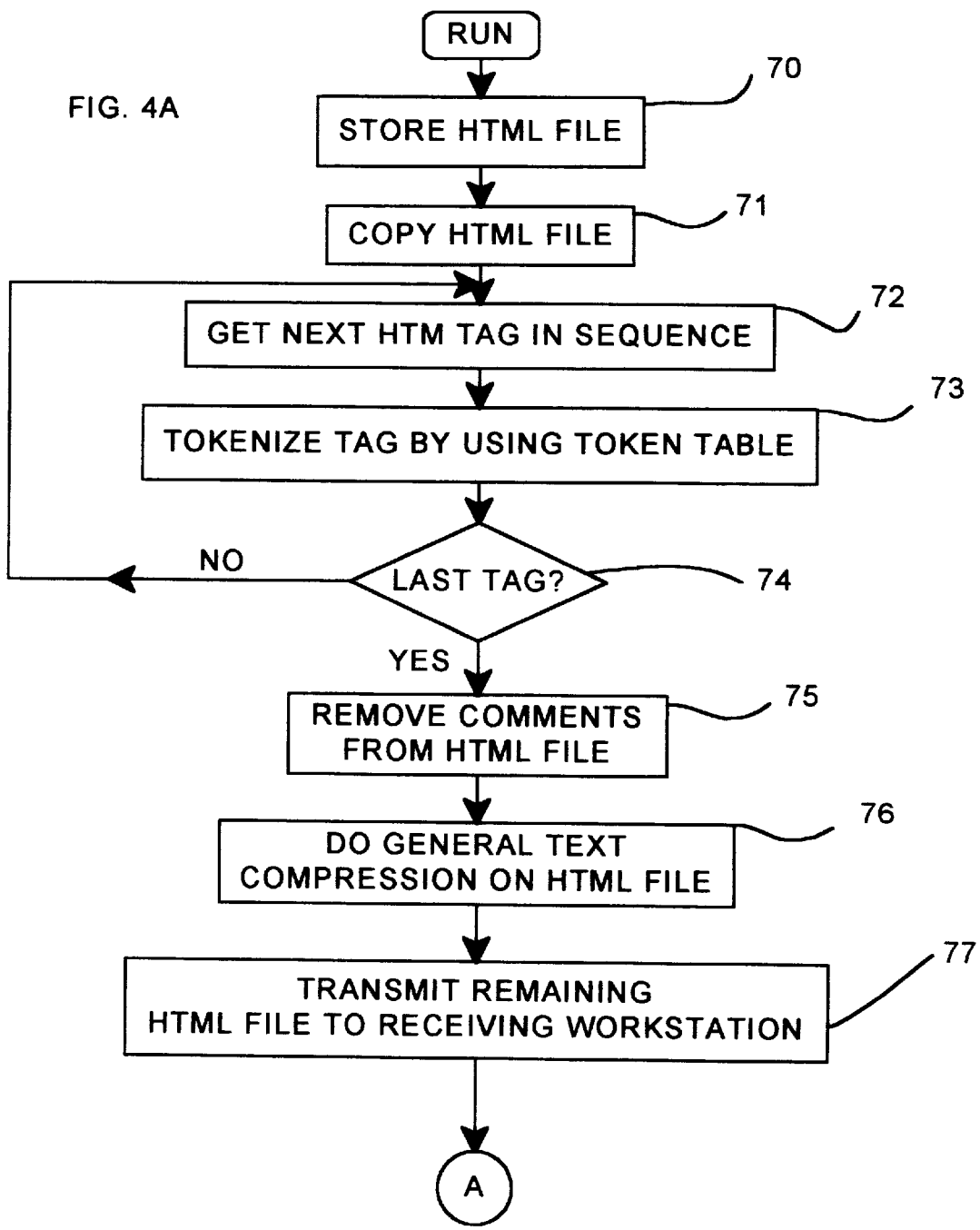
FIG. 4 is a flowchart showing how the operations of FIG. 3 may be implemented in specific programming steps.
Figure 4B:
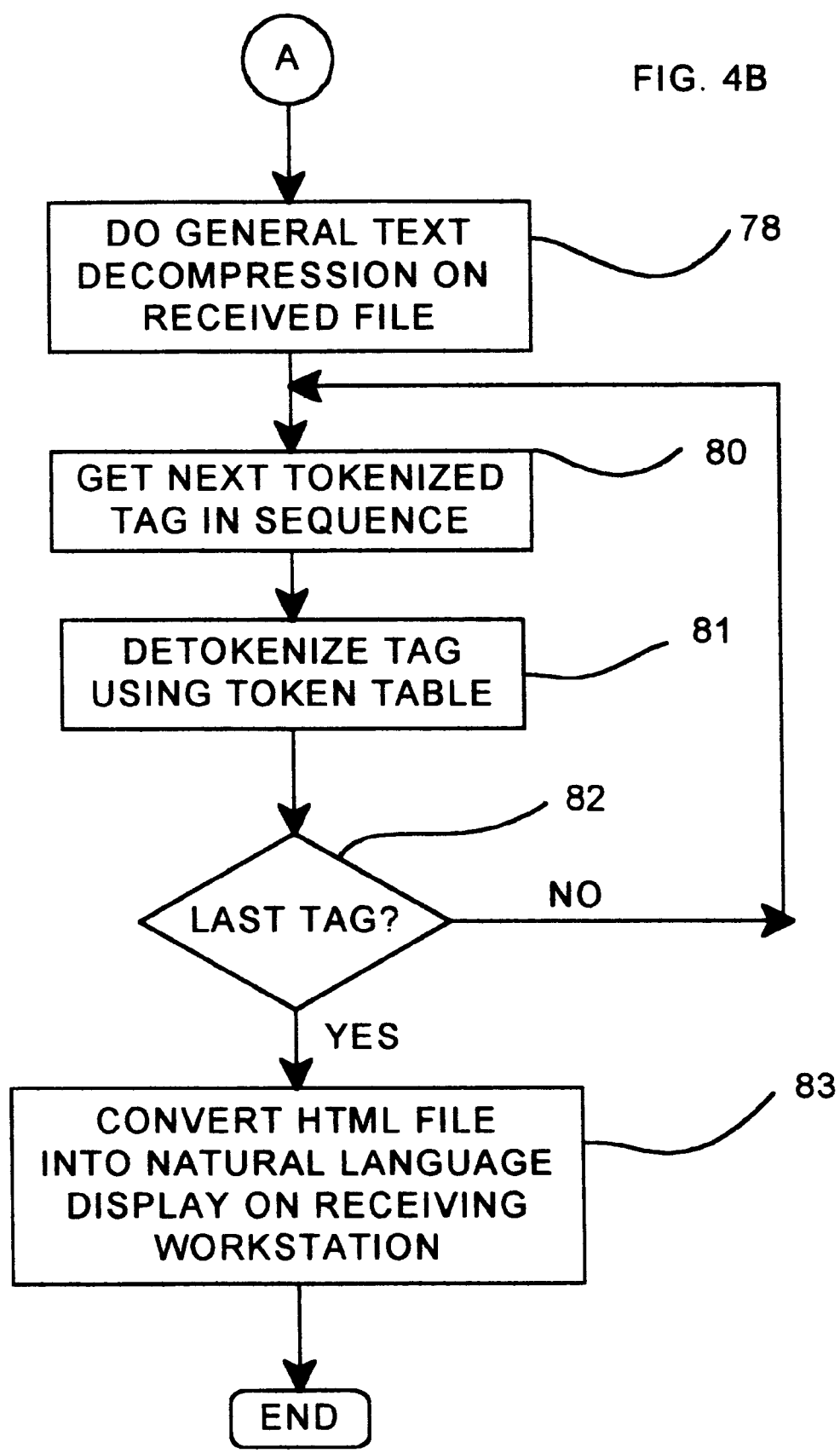

Now with respect to FIG. 4, we will proceed through more specific steps in implementation of the procedures and programs of FIG. 3. In the running of the program, the HTML documentation for a particular web page selected by an interactive user at receiving workstation 56, 57, FIG. 2, is accessed from the internet 50 or World Wide Web by network access server 53. The HTML file which represents the web page is stored in its entirety, step 70, and a copy is made for transmission, step 71. Prior to transmission of this copy, the program runs through the sequence of HTML tags, gets the next tag, step 72, and tokenizes it, step 73, using a lookup table to substantially reduce the quantity of data representing the original HTML files which would otherwise have to be transmitted. The following table is a representative portion of the lookup table:

LOOKUP TABLE

| TAG | Start | End | TAG | Start | End |
|-----|-------|-----|-----|-------|-----|
| <HTML> | <HT> | <ht> | HREF | HA | n/a |
| <BODY> | <BD> | <bd> | BACKGROUND | BG | n/a |
| <HEAD> | <HD> | <hd> | BGCOLOR | BC | n/a |
| <TITLE> | <TI> | <ti> | COLOR | CR | n/a |
| <TABLE> | <TB> | <tb> | SIZE | SZ | n/a |
| <CENTER> | <CN> | <cn> | INPUT | IN | n/a |
| <FORM> | <FM> | <fm> | TYPE | TP | n/a |
| <FONT> | <FT> | <ft> | VALUE | VL | n/a |
| <CAPTION> | <CP> | <cp> | BORDER | BD | n/a |
| <SELECT> | <SL> | <sl> | WIDTH | WD | n/a |
| <TD> | <TD> | <td> | TEXT | TX | n/a |
| <BLOCKQUOTE> | <BQ> | <bq> | NAME | NM | n/a |
| <P> | <P> | <p> | CELLPADDING | CL | n/a |
| <B> | <B> | <b> | LINK | LK | n/a |
| <TT> | <TT> | <tt> | VLINK | VL | n/a |
| <TR> | <TR> | <tr> | ALINK | AL | n/a |
| <APPLET> | <AP> | <ap> | MAXLENGTH | ML | n/a |
| <OPTION> | <OP> | n/a | AREA | AR | n/a |

The HTML tags are changed in sequence and at each tag, decision step 74, a determination is made as to whether the last tag in the document has been reached. If No, then the process is returned to step 72 and the next tag is obtained. When the last tag is reached, the program moves to step 75 wherein all comments are removed from the HTML file. The comments in the HTML file are of value primarily to programmers or those modifying or updating programs. These comments have no value to those browsing the web pages and do not justify the strain their transmission puts on downloading HTML pages.

At this point, the tokenized HTML file is compressed, step 76, by using any conventional method known in the art for doing general text compression. One example of a general text compression method which may be used is that described in U.S. Pat. No. 5,051,745, *String Searcher and Compressor, Using the Same,* Katz. After the general compression, the remaining HTML file is transmitted to the receiving display 57, via computer 56, FIG. 2, via branch A in FIG. 4, step 77. It should be noted that this transmission need not be made immediately. This optimized version of the original HTML file may be stored for later transmission.

Upon receiving the transmitted HTML file, a decompression is done, step 78, on workstation computer 56 by using the complement of the general text compression technique. Then, detokenization is carried out by sequentially getting the next tokenized tag, step 80 and detokenizing it via the above Lookup Table techniques, step 81. A determination is made, decision step 82, as to whether the last tag has been reached. If not, the process is returned to step 80 and detokenization is continued. When the last tag has been detokenized, then, step 83, the HTML file is converted into a natural language display on workstation display 57, FIG. 2, by using conventional HTML conversion techniques.

Although certain preferred embodiments have been shown and described, it will be understood that many changes and modifications may be made therein without departing from the scope and intent of the appended claims.

What is claimed is:

1. In a data processor controlled display system for displaying documents including natural language text representative of data transmitted to display stations from a location remote from said stations, means at said remote location for storing said data in a markup language format including tags identifying the contents of said data, means for tokenizing only said tags, means for transmitting said data including said tokenized tags to at least one of said display stations, means for detokenizing said tokenized tags received at said one display station whereby said received data is restored to said markup language format, and means associated with said display station for translating said received data from said markup language format into said displayed natural language text documents.

2. The data processor controlled display system of claim 1 wherein said markup language is Hypertext Markup Language (HTML).

3. The data processor controlled display system of claim 2 wherein said stored data includes data portions identified by said tags as comments and said system further includes means for removing said data portions identified as comments prior to transmitting said data.

4. The data processor controlled display system of claim 3 further including general data compression means for compressing, prior to said transmitting, the data portions remaining after comments removal, and means for decompressing said compressed data portions received at said one display station whereby said received data is restored to said markup language format.

5. A computer implemented method for displaying documents including natural language text representative of data transmitted to display stations from a location remote from said stations comprising:

storing at said remote location said data in a markup language format including tags identifying the contents of said data, tokenizing only said tags, transmitting said data including said tokenized tags to at least one of said display stations, detokenizing said tokenized tags received at said one display station whereby said received data is restored to said markup language format, and translating said received data from said markup language format into said displayed natural language text documents.

6. The method of claim 5 wherein said markup language is Hypertext Markup Language (HTML).

7. The method of claim 6 wherein said stored data includes data portions identified by said tags as comments and including the further step of removing said data portions identified as comments prior to transmitting said data.

8. The method of claim 7 further including the step of performing a general data compression, prior to said transmitting, on the data portions remaining after comments removal, and decompressing said compressed data portions received at said one display station whereby said received data is restored to said markup language format.

9. A computer program having data structures included on a computer readable said program being for transmission and display of documents including natural language text representative of data transmitted to display stations from a location remote from said stations and comprising:

means at said remote location for storing said data in a markup language format including tags identifying the contents of said data, means for tokenizing only said tags, means for transmitting said data including said tokenized tags to at least one of said display stations, means for detokenizing said tokenized tags received at said one display station whereby said received data is restored to said markup language format, and means associated with said display station for translating said received data from said markup language format into said displayed natural language text documents.

10. The computer program according to claim 9, wherein said markup language is Hypertext Markup Language (HTML).

11. The computer program according to claim 10 wherein said stored data includes data portions identified by said tags as comments and said system further includes means for removing said data portions identified as comments prior to transmitting said data.

12. The computer program according to claim 11 further including general data compression means for compressing, prior to said transmitting, the data portions remaining after comments removal, and means for decompressing said compressed data portions received at said one display station whereby said received data is restored to said markup language format.

* * * * *

UNITED STATES PATENT AND TRADEMARK OFFICE
CERTIFICATE OF CORRECTION

PATENT NO.   : 6,311,223 B1
DATED        : October 30, 2001
INVENTOR(S)  : Bodin et al.

It is certified that error appears in the above-identified patent and that said Letters Patent is hereby corrected as shown below:

<u>Column 8,</u>
Line 12, after "readable" please insert -- medium --.

Signed and Sealed this

Sixth Day of August, 2002

Attest:

JAMES E. ROGAN
*Attesting Officer*            *Director of the United States Patent and Trademark Office*